United States Patent
Mohri et al.

[11] Patent Number: 6,165,437
[45] Date of Patent: *Dec. 26, 2000

[54] α-ALUMINA

[75] Inventors: Masahide Mohri; Yoshio Uchida; Yoshinari Sawabe; Hisashi Watanabe, all of Ibaraki, Japan

[73] Assignee: Sumitomo Chemical Co., Ltd., Osaka, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/805,044

[22] Filed: Feb. 24, 1997

Related U.S. Application Data

[63] Continuation of application No. 08/343,521, filed as application No. PCT/JP93/00738, Jun. 1, 1993, abandoned.

[30] Foreign Application Priority Data

Jun. 2, 1992 [JP] Japan ..................... 4-168385
Oct. 28, 1992 [JP] Japan ..................... 4-314052

[51] Int. Cl.$^7$ ..................................... C01F 7/02
[52] U.S. Cl. ............................................. 423/625
[58] Field of Search ..................... 423/133, 625; 117/950

[56] References Cited

U.S. PATENT DOCUMENTS

| | | | |
|---|---|---|---|
| 3,175,883 | 3/1965 | Lindsay et al. | 423/625 |
| 3,262,754 | 7/1966 | Lindsay et al. | 423/625 |
| 4,374,119 | 2/1983 | Schepers et al. | 423/625 |
| 4,822,592 | 4/1989 | Misra | 423/625 |
| 5,302,368 | 4/1994 | Harato et al. | 423/626 |
| 5,538,709 | 7/1996 | Mohri et al. | 423/625 |
| 5,672,554 | 9/1997 | Mohri et al. | 501/153 |

FOREIGN PATENT DOCUMENTS

| | | |
|---|---|---|
| 0105025 | 4/1984 | European Pat. Off. . |
| 0281265 | 9/1988 | European Pat. Off. . |
| WO 90 15777 | 12/1990 | WIPO . |

OTHER PUBLICATIONS

62th CATSJ Meeting Abstracts: No. 2D105 (with full English translation thereof), 1988, no month, by Ayame, et al.

*Primary Examiner*—Steven Bos
*Attorney, Agent, or Firm*—Sughrue, Mion, Zinn, Macpeak & Seas, PLLC

[57] ABSTRACT

α-Alumina comprising α-alumina single crystal particles which are homogeneous containing no crystal seed inside the particles; have an octa- or higher polyhedral shape; have a D/H ratio of from 0.5 to 3.0, wherein D represents a maximum particle diameter parallel to a hexagonal lattice plane of a hexagonal close-packed lattice of the particles, and H represents a diameter perpendicular to the hexagonal lattice plane; have a number average particle diameter of more than 5 μm and not more than 30 μm; have a sodium content of less than 5 ppm in terms of $Na_2O$; and have an alumina purity of not less than 99.90% by weight. α-Alumina in a powder form composed of α-alumina single crystal particles having a high punity, a fine and uniform composition, a narrow particle size distribution, and an octa- or higher polyhedral shape which are not aggromerates. The α-alumina of the invention is useful as an abrasive, a raw material for sintered products, a raw material for a encapsulations, a raw material for ceramic filters, etc. and, owing to its high purity, particularly useful as a raw material for single crystals, e.g., yttrium aluminum garnet (YAG), sapphire, ruby, etc. and as a raw material for high purity sintered products.

4 Claims, 4 Drawing Sheets

10 μm

10 μm

|←—→|
10 μm

|←———→|
10 μm

ND# α-ALUMINA

This is a Continuation of application Ser. No. 08/343,521 filed Feb. 2, 1995, which is a 371 of PCT/JP93/00738 filed Jul. 1, 1993, now abandoned.

TECHNICAL FIELD

This invention relates to α-alumina. α-Alumina powder has been widely used as an abrasive, a raw material for sintered products, a plasma spraying material, a filler and the like. The α-alumina of this invention comprises α-alumina single crystal particles which are not agglomerated particles and have high purity, structural homogeneity, and a narrow particle size distribution, and is of high industrial use as an abrasive, a raw material for sintered products, a plasma spraying material, a filler, a raw material for single crystals, a raw material for a carrier for catalysts, a raw material for fluorescent substances, a raw material for encapsulations, a raw material for ceramic filters, etc. The α-alumina of the present invention has extremely high purity and is particularly useful as a starting material for single crystals of yttrium aluminum garnet (YAG), sapphire, ruby, etc. and a raw material for high purity sintered products to which low purity α-alumina cannot be applied.

BACKGROUND ART

α-Alumina powder is widely used as an abrasive, a raw material of sintered products, a plasma spraying material, a filler, etc. α-Alumina powder obtained by conventional processes comprises irregular-shaped polycrystals, contains many agglomerates, and has a broad particle size distribution. For some uses, the purity of these conventional species is insufficient. In order to eliminate these problems, α-alumina powder produced by special processes as hereinafter described has been employed for specific uses. However, these special processes still fail to arbitrarily control the shape or particle diameter of α-alumina. It has thus been difficult to obtain α-alumina powder having a narrow particle size distribution.

Known special processes for producing α-alumina powder include a process utilizing a hydrothermal reaction of aluminum hydroxide (hereinafter referred to as hydrothermal treatment process); a process comprising adding a flux to aluminum oxide, fusing, and precipitating (hereinafter referred to as flux process); and a process in which aluminum hydroxide is calcined in the presence of a mineralizer.

With respect to a hydrothermal process, JP-B-57-22886 (the term "JP-B" as used herein means an "examined published Japanese patent application") discloses a process in which corundum is added as a seed crystal to control the particle size. The process consists of synthesis in a high temperature under a high pressure, making the resulting α-alumina powder expensive.

According to the study by Matsui, et al. (*Hydrothermal Hannou* (Hydrothermal Reactions), Vol. 2, pp. 71–78 "Growth of Alumina Single Crystal by Hydrothermal Methods"), an α-alumina single crystal obtained by growth of an alumina single crystal containing chromium on a sapphire (α-alumina) seed crystal by a hydrothermal growth process (hydrothermal treatment process) contains cracks. On examining the homogeneity of the crystal in an attempt to clarify the cause of the cracks, it was confirmed that a high strain exists in the boundary between the seed crystal and the grown crystal and that the density of etch pit in the grown crystal near the boundary, which seems to correspond to the dislocation density, is high. The report goes that the cracks are expected to relate to such a strain or a defect and that a hydrothermal growth process is apt to involve incorporation of a hydroxyl group or water into crystals, which appears to cause a strain or a defect.

A flux process has been proposed as a means for controlling the shape or particle size of α-alumina powder for use as an abrasive, a filler, etc. For example, JP-A-3-131517 (the term "JP-A" as used herein means an "unexamined published Japanese patent application") discloses a process comprising calcining aluminum hydroxide in the presence of a flux with fluorine having a melting point of not more than 800° C. to prepare α-alumina particles having an average particle size of from 2 to 20 μm and a hexagonal plate shape having a D/H ratio of from 5 to 40, wherein D represents a maximum particle diameter parallel to a hexagonal lattice plane of a hexagonal close-packed lattice of α-alumina, and H represents a diameter perpendicular to the hexagonal lattice plane. However, this process cannot provide fine α-alumina powder having a particle diameter of not more than 2 μm, and all the particles obtained have a plate shape. Therefore, the resulting α-alumina powder is not always suitable for use as abrasives, fillers and a raw materials for single crystals.

Several proposals have been made to date as a solution to these problems. JP-A-59-97528 discloses a process for improving the shape of α-alumina particles comprising calcining aluminum hydroxide prepared by the Bayer process in the presence of boron containing ammonium and a boron mineralizer to obtain α-alumina powder having an average particle diameter of from 1 to 10 μm and a D/H ratio approximate to 1. However, this process involves problems in that the boron-containing or fluorine-containing material added as a mineralizer remains in the resulting α-alumina and agglomerates are formed upon calcining.

In connection to calcination of sodium-containing aluminum hydroxide prepared by the Bayer process, it has been proposed to conduct calcining in the presence of a fluoride, e.g., aluminum fluoride or cryolite, and a chlorine-containing compound, e.g., chlorine or hydrogen chloride in British Patent 990,801; or calcining in the presence of boric acid, and ammonium chloride, hydrochloric acid or aluminum chloride in West German Patent 1,767,511, for the purpose of effectively removing sodium while controlling the particle diameter.

However, in the former process, since a mineralizer such as aluminum fluoride is added in a solid form or the calcination is conducted while supplying chlorine gas and fluorine gas without the addition of water, the resulting alumina particles have problems of an irregular shape and a broad particle size distribution. The latter process also involves a problem in that boric acid as a mineralizer remains in the resulting α-alumina in the form of a boron-containing material. In addition, these processes aim chiefly at removal of sodium, and the sodium salt, such as NaCl or $Na_2SO_4$, by-produced by the reaction between sodium and a sodium removing agent must be sublimed or decomposed by calcination at a high temperature of at least 1,200° C.

With respect to the reaction between alumina and hydrogen chloride gas, there is a report in *Zeit. fur Anorg. und Allg. Chem.*, Vol 21, p. 209 (1932) of an equilibrium constant of the reaction system comprising sintered α-alumina having a particle diameter of from 2 to 3 mm, hydrogen chloride, and produced aluminum chloride. According to the report, while α-alumina is found produced in a place different from the place where the starting material has been charged, only hexagonal plate-shaped particles are obtained.

JP-B-43-8929 discloses a process comprising calcining alumina hydrate in the presence of ammonium chloride to produce alumina having a low impurity content and an average particle diameter of not more than 10 μm. The resulting alumina powder has a broad particle size distribution.

Therefore, none of the conventional techniques succeeded in providing α-alumina single crystals and satisfying requirements of purity and structural homogeneity of individual particles.

An object of the present invention is to solve the above problems and to obtain high purity α-alumina which comprises homogeneous and non-agglomerated α-alumina single crystal particles from various raw materials. More specifically, it is to provide α-alumina in the form of powder comprising uniform α-alumina single crystal particles which have an octa- or higher polyhedral shape, a D/H ratio of from 0.5 to 3.0, a number average particle diameter of more than 5 μm and not more than 30 μm, a narrow particle size distribution, a high alumina purity and uniform composition within the particle, with the individual particles being freed of structural strain.

DISCLOSURE OF THE INVENTION

The present invention relates to the following inventions.

(1) α-Alumina comprising α-alumina single crystal particles characterized in that they are homogeneous containing no crystal seed inside the particles; have an octa- or higher polyhedral shape; have a D/H ratio of from 0.5 to 3.0, wherein D represents a maximum particle diameter parallel to a hexagonal lattice plane of a hexagonal close-packed lattice of the particles, and H represents a diameter perpendicular to the hexagonal lattice plane; have a number average particle diameter of more than 5 μm and not more than 30 μm; have a sodium content of less than 5 ppm in terms of $Na_2O$; and have an alumina purity of not less than 99.90% by weight.

(2) α-Alumina as described in (1) above, characterized in that the α-alumina single crystal particles have such a particle size distribution that the D90/D10 ratio is not more than 10, wherein D10 and D90 represent a cumulative 10% diameter and a cumulative 90% diameter, respectively, of a cumulative distribution depicted from the small diameter side.

(3) α-Alumina as described in (1) or (2) above, characterized in that the A-alumina has an alumina purity of not less than 99.95% by weight.

(4) α-Alumina as described in (1), (2) or (3) above, wherein the α-Alumina is a raw material for production of a single crystal.

(5) α-Alumina as described in (1), (2) or (3) above, wherein the α-alumina is a raw material for production of a high purity sintered product.

BEST MODE FOR PRACTICING THE INVENTION

Figure 1:
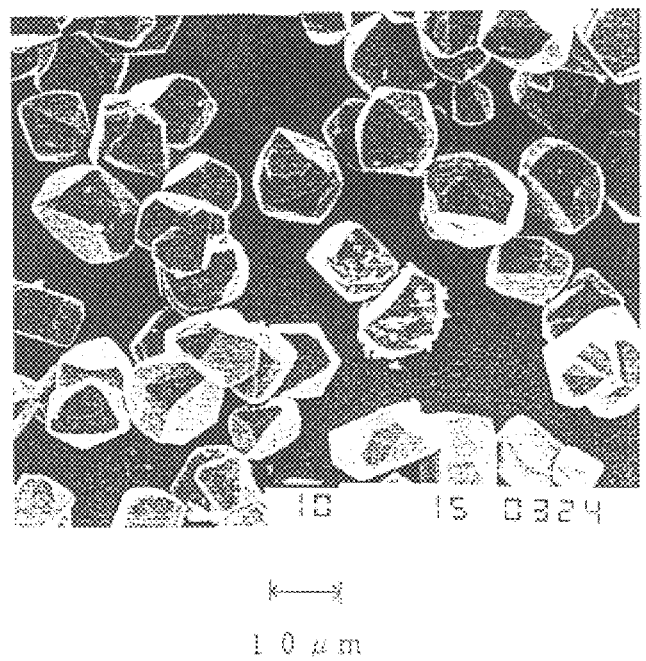
FIG. 1 is a scanning electron microscope (SEM) photograph (magnification: 930) showing the particulate shape of the α-alumina obtained in Example 1.

The present invention is described in detail below.

The α-alumina according to the present invention can be prepared from transition alumina or a raw material capable of being converted to transition alumina on heating. Transition alumina means all alumina crystal phases included under polymorphic alumina represented by $Al_2O_3$ except α-alumina, specifically including γ-alumina, δ-alumina, θ-alumina, etc.

The raw material converted to transition alumina on heating includes those which are once converted to transition alumina and then to α-alumina by calcining, such as aluminum hydroxide, aluminum sulfate, alum, e.g., potassium aluminum sulfate, ammonium aluminum sulfate, ammonium aluminum carbonate hydroxide, and alumina gel, e.g., alumina gel obtained by oxidation of aluminum by electro-discharge in water.

Synthesis methods of the transition alumina and the raw material converted to transition alumina on hearing are not particularly limited. Aluminum hydroxide, for example, can be obtained by the Bayer process, hydrolysis of an organoaluminum compound, or a process using, as a starting material, an aluminum compound recovered from an etching waste used for condensers, etc.

Transition alumina can be obtained by a heat treatment of aluminum hydroxide, decomposition of aluminum sulfate, decomposition of alum, vapor phase decomposition of aluminum chloride, or decomposition of ammonium aluminum carbonate.

The transition alumina or the raw material converted to transition alumina on heating is calcined in an atmosphere containing at least 1% by volume, preferably at least 5% by volume, and more preferably at least 10% by volume, of hydrogen chloride gas. Gases for dilution of hydrogen chloride gas include inert gases, e.g., nitrogen and argon, hydrogen and air. The pressure of the hydrogen chloride-containing atmosphere is not particularly limited and is selected arbitrarily from an industrially practical range. α-Alumina in a powder form having the excellent properties as desired can thus be obtained by calcining in a relatively low temperature as hereinafter described.

Hydrogen chloride gas may be replaced with a mixed gas of chlorine and steam. In this case, transition alumina or the raw material converted to transition alumina on heating is calcined, while at least 1% by volume, preferably at least 5% by volume, and more preferably at least 10% by volume, of chlorine gas and at least 0.1% by volume, preferably at least 1% by volume, and more preferably at least 5% by volume, of steam are introduced to an atmosphere. Gases for diluting the mixed gas of chlorine and steam include inert gases, e.g. nitrogen and argon, hydrogen and air. The pressure of the chlorine- and steam-containing atmosphere is not particularly limited and is selected arbitrarily from an industrially practical range. α-Alumina in a powder form having the excellent properties as desired can thus be obtained by calcining in a relatively low temperature as hereinafter described.

The calcining temperature is generally 600° C. or higher, preferably from 600 to 1,400° C., more preferably from 700 to 1,300° C., and most preferably from 800 to 1,200° C. By calcining at a temperature controlled within this range, α-alumina in a powder form comprising α-alumina single crystal particles which are hardly agglomerated and, even immediately after calcination, show a narrow particle size distribution can be obtained at an industrially advantageous rate of formation.

A proper calcining time depends on the concentration of the gas in the calcining atmosphere and the calcining temperature but is preferably 1 minute or more, and more preferably 10 minutes or more. The calcining time is sufficient if the alumina raw material undergoes crystal growth to form α-alumina. Desired α-alumina in a powder form can be obtained in a shorter calcining time than required in the conventional processes.

The source and the mode of supplying the gas of the calcining atmosphere are not particularly restricted as long as the chlorine-containing gas is introduced into the reaction system containing the starting material. For example, the component gases may be supplied from gas cylinders. Where a chlorine compound, e.g., hydrochloric acid solution, ammonium chloride, or a chlorine-containing high polymer is used as a source for the chlorine gas, it is used at its vapor pressure or as decomposed so as to give a prescribed gas composition. In some cases of using decomposition gas of ammonium chloride, etc., a solid substance deposits in a calcining furnace to cause operational troubles. Further, as the hydrogen chloride gas concentration increases, the calcination can be effected at a lower temperature in a shorter time, and the purity of the resulting α-alumina can be increased. Accordingly, it is preferable to supply hydrogen chloride or chlorine directly from a gas cylinder into a calcining furnace. The gas supply may be either in a continuous manner or in a batch system.

The calcining apparatus is not particularly limited, and a conventional calcining furnace can be employed. The calcining furnace is preferably made of a material resistant to corrosion by hydrogen chloride gas, chlorine gas, etc. The furnace is preferably equipped with a mechanism for controlling the atmosphere. Because an acid gas, e.g., hydrogen chloride or chlorine gas, is used, the furnace is preferably air-tight. For industrial production, calcination is preferably carried out in a continuous manner by means of, for example, a tunnel kiln, a rotary kiln, a pusher kiln, etc.

Since the reaction proceeds in an acidic atmosphere, a crucible, a boat or a like tool used in the process is preferably made of alumina, quartz, acid resistant brick, or graphite.

In order to obtain α-alumina of the present invention which has an alumina purity of not less than 99.90% by weight and comprises α-alumina single crystal particles having a number average particle diameter of more than 5 μm and not more than 30 μm, it is preferred to select a raw material having a high alumina purity of not less than 99.9% by weight from the above-described raw materials.

Examples of particularly preferred raw materials include aluminum hydroxide powder obtained by hydrolysis of aluminum isopropoxide and transition alumina obtained by heat-treating such aluminum hydroxide.

The single crystal particles constituting the α-alumina of the present invention have number average particle diameter of more than 5 μm and not more than 30 μm, a D/H ratio of from 0.5 to 3.0, and a D90/D10 ratio of not more than 10, preferablly not more than 9, and more preferably not mroe than 7, wherein D10 and D90 represent a cumulative 10% diameter and a cumulative 90% diameter, respectively of cumulative distribution depicted from the small diameter side, and an extremely high purity, i.e., an alumina purity of 99.90% by weight or higher and a sodiam content of less than 5 ppm in terms of $Na_2O$.

EXAMPLE

The present invention will now be illustrated in greater detail with reference to Examples, but it should be understood that the present invention is not construed as being limited thereto.

Various measurements in Examples and Comparative Examples were made as follows.

1. Particle Diameter and Particle Diameter Distribution of α-Alumina:

(1) A D90/D10 ratio was measured by the laser scattering method with "Master Sizer" manufactured by Malvern Instruments, Ltd.

(2) A micrograph of α-alumina was taken with an SEM ("T-300" manufactured by Japan Electron Optics Laboratory Co., Ltd., hereinafter the same), and selected 80 to 100 particles of the SEM photograph were subjected to image analysis to obtain an average and a distribution of their circle-equivalent diameters. The term "circle-equivalent diameter" as used herein means a diameter of a true circle having the same area as a particle.

2. Crystal Shape (D/H) of α-Alumina:

The shape of α-alumina particles was represented in terms of a D/H ratio, wherein D and H are as defined above. A D/H ratio of α-alumina was obtained as an average of 5 to 10 particles by image analysis of the above-mentioned SEM photograph.

3. Number of Crystal Faces and Crystal Habit:

(1) The number of crystal faces of α-alumina was obtained by observation of the above-mentioned SEM photograph.

(2) The crystal habit of α-alumina particles was observed for evaluating the shape. The crystal habit of the α-alumina particles obtained in the present invention (indicated by A to I) is shown in FIG. 6. α-Alumina has a hexagonal system, and the term "crystal habit" used for α-alumina means the form of its crystal characterized by the appearance of the crystal faces composed of a plane {1120}, c plane {0001}, n plane {2243}, and r plane {1012}. In FIG. 6 are shown crystal planes a, c, n, and r.

4. Alumina Purity:

The amount of ions of incorporated impurities was measured by emission spectrochemical analysis to obtain the content of the impurities on oxide conversion. The chlorine content was measured by potentiometry. An alumina purity was obtained by subtracting the total impurity content (wt %) thus calculated from 100% by weight.

5. $Na_2O$ Content:

The amount of a sodium ion incorporated was measured by emission spectrochemical analysis to obtain the content of $Na_2O$.

Raw materials used in Examples were as follows.

1. Transition Alumina A:

Transition alumina obtained by calcination of aluminum hydroxide prepared by hydrolysis of aluminum isopropoxide ("AKP-G15" produced by Sumitomo Chemical Co., Ltd.; secondary particle diameter: about 4 μm)

2. Aluminum Hydroxide A:

Aluminum hydroxide powder synthesized by hydrolysis of aluminum isopropoxide (secondary particle diameter: about 8 μm)

3. Aluminum Hydroxide C:

Aluminum hydroxide powder prepared by the Bayer process ("C 12" produced by Sumitomo Chemical Co., Ltd.; secondary particle diameter: about 47 μm)

Hydrogen chloride in a cylinder produced by Tsurumi Soda K.K. (purity: 99.9%) was used as a hydrogen chloride gas source, and chlorine in a cylinder produced by Fujimoto Sangyo K.K. (purity: 99.4%) was used as a chlorine gas source. The volume percent of steam was controlled by adjusting the saturated vapor pressure of water dependent on temperature and introduced into a furnace with nitrogen gas.

An alumina boat was filled with 0.4 g of a raw material, such as transition alumina or aluminum hydroxide, to a depth of 5 mm. Calcination of the raw material was conducted in a tube furnace ("DSPSH-28" manufactured by Motoyama K.K.) using a quartz tube (diameter: 27 mm; length: 1,000 mm). The temperature was increased at a rate of 500° C./hour while introducing nitrogen, and hydrogen chloride gas or a mixed gas of chlorine and steam was introduced into the furnace when a prescribed temperature was reached.

The gas concentration was controlled by adjustment of the gas flow rate by means of a flowmeter. The linear flow rate of the gas was set at 20 mm/sec. This system was hereinafter referred to as a gas flow system. In Comparative Example 1 using a low hydrogen chloride gas concentration, calcination was carried out by a system in which introduction of the gas was ceased after a prescribed concentration was reached. The total pressure of the atmospheric gases was atmospheric pressure.

The steam partial pressure was controlled by adjusting the saturated vapor pressure, and steam was fed to the furnace with nitrogen gas.

EXAMPLES 1 TO 3 AND 5

Aluminum hydroxide or transition alumina (γ-alumina) was calcined in a hydrogen chloride gas atmosphere at a calcining temperature of 1,100° C. or 800° C.

Figure 2:
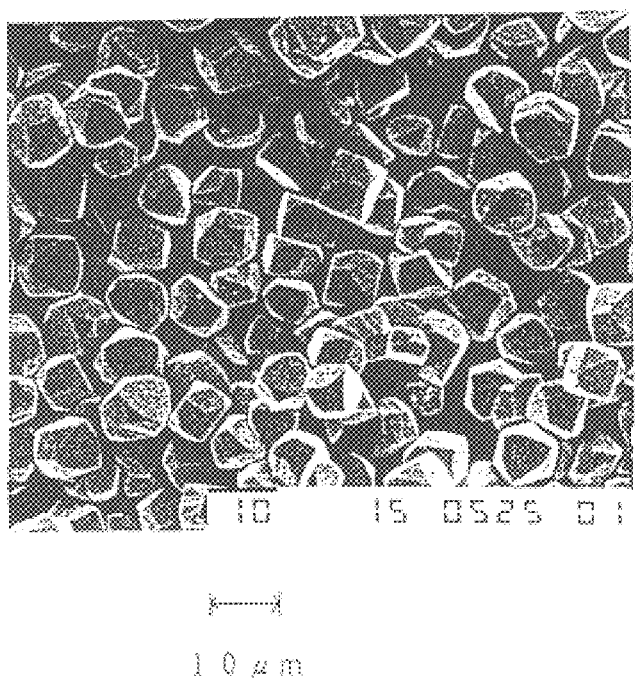
FIG. 2 is a scanning electron microscope (SEM) photograph (magnification: 930) showing the particulate shape of the α-alumina obtained in Example 2.
Figure 3:
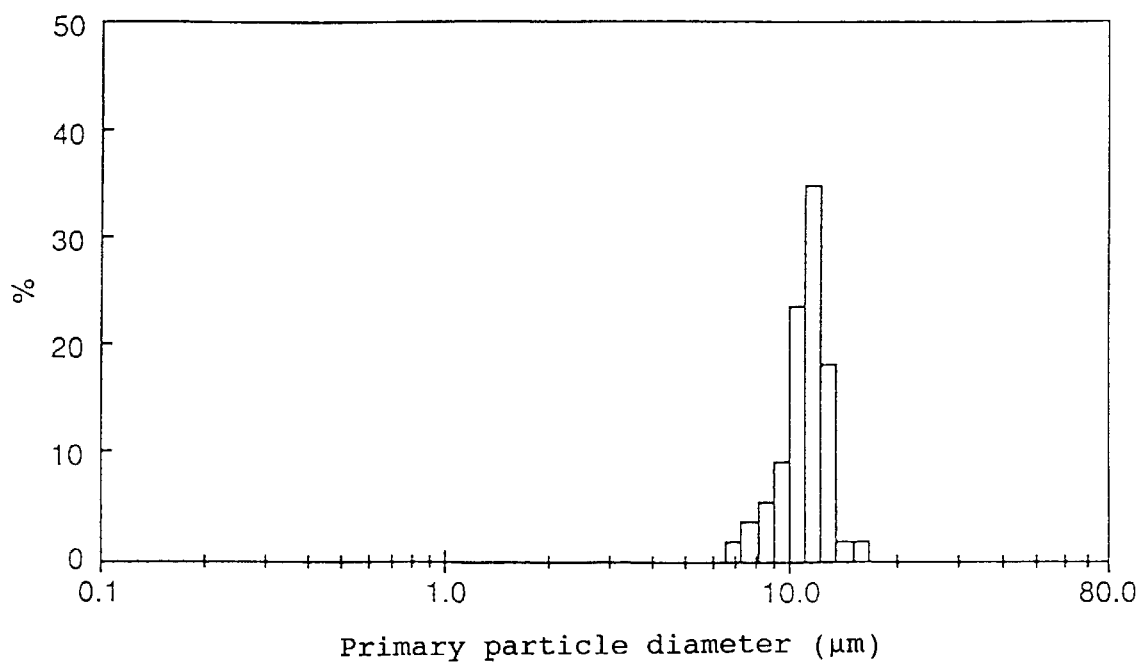
FIG. 3 is a particle size distribution of the α-alumina obtained in Example 2.

The calcining conditions and the results are shown in Tables 1 and 2, respectively. The SEM photographs of the α-alumina obtained in Examples 1 and 2 are shown in FIGS. 1 and 2, respectively. The particle diameter distribution of the α-alumina in a powder form obtained in Example 2 is shown in FIG. 3.

EXAMPLE 4

Calcination of transition alumina was carried out in an atmosphere consisting of 35 vol % of chlorine gas, 5 vol % of steam, and 60 vol % of nitrogen gas. The resulting α-alumina was as highly pure as that obtained in Example 1. The calcining conditions and the results are shown in Tables 1 and 2.

COMPARATIVE EXAMPLES 1 TO 3

Figure 4:
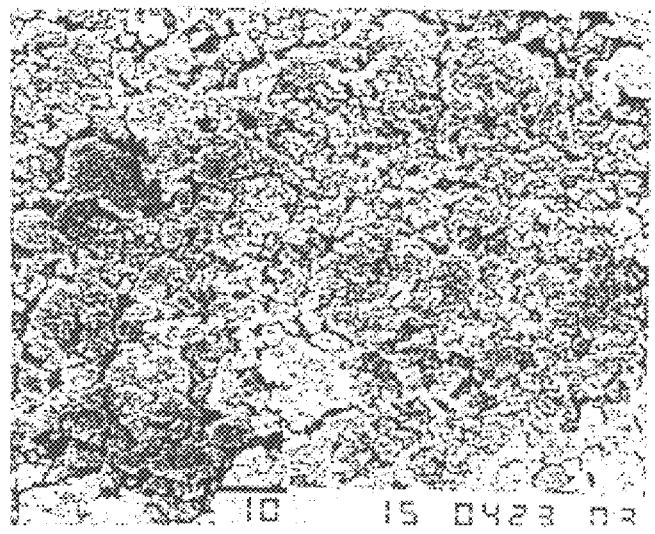
FIG. 4 is an SEM photograph (magnification: 930) showing the particulate shape of the α-alumina obtained in Comparative Example 1.
Figure 5:
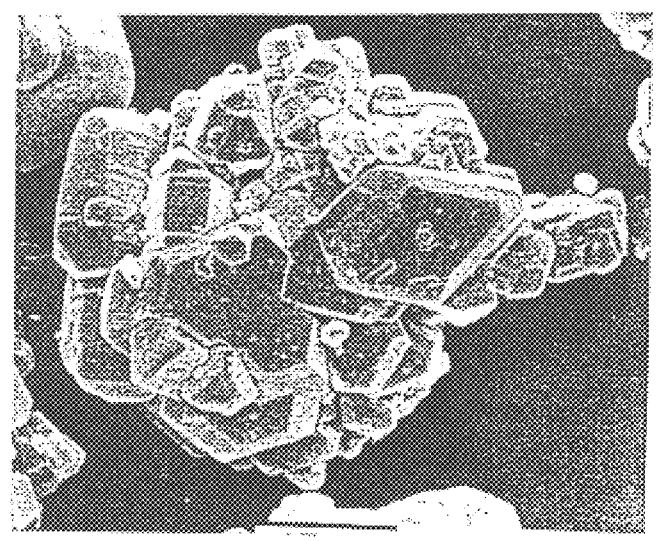
FIG. 5 is an SEM photograph (magnification: 1,900) showing the particulate shape of the α-alumina obtained in Comparative Example 2.
Figure 6A:
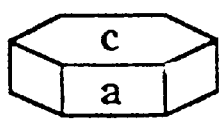
FIG. 6 shows the crystal habit of an α-alumina single crystal.
Figure 6D:
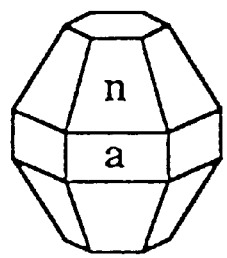
Figure 6G:
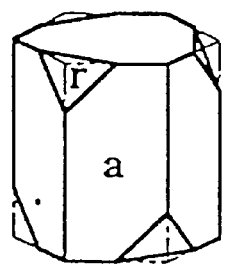
Figure 6B:
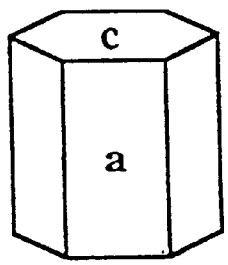
Figure 6E:
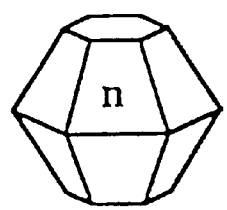
Figure 6H:
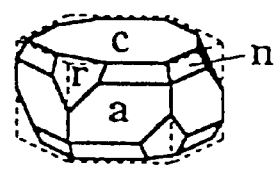
Figure 6C:
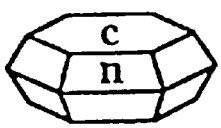
Figure 6F:
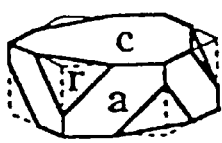
Figure 6I:
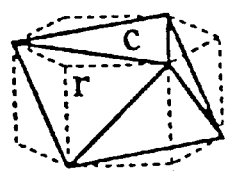

An alumina raw material was calcined in an atmosphere having a low hydrogen chloride gas concentration or in accordance with a conventional process. The conditions and the results are shown in Tables 1 and 2. The SEM photographs of the α-alumina in a powder form obtained in Comparative Examples 1 and 2 are shown in FIGS. 4 and 5, respectively.

TABLE 1

| | Alumina | | Composition of Atmosphere (vol %) | | | | | Gas Flow Rate | Temp. for Gas Introduction | Calcining Temp. | Keeping Time |
|---|---|---|---|---|---|---|---|---|---|---|---|
| | Kind | Size (μm) | HCl | Cl$_2$ | H$_2$O | N$_2$ | H$_2$ | (mm/min) | (° C.) | (° C.) | (min) |
| Example 1 | transition alumina A | 4 | 100 | — | — | — | — | 20 | 20 | 1,100 | 30 |
| Example 2 | transition alumina A | 4 | 30 | — | — | 70 | — | 20 | 20 | 1,100 | 30 |
| Example 3 | transition alumina A | 4 | 100 | — | — | — | — | 20 | 20 | 800 | 120 |
| Example 4 | transition alumina A | 4 | — | 35 | 5 | 60 | — | 20 | 20 | 1,100 | 30 |
| Example 5 | aluminum hydroxide A | 8 | 30 | — | — | 70 | — | 20 | 800 | 1,100 | 30 |
| Comparative Example 1 | transition alumina A | 4 | 0.5 | — | — | 99.5 | — | 0 | 20 | 1,100 | 600 |
| Comparative Example 2 | aluminum hydroxide C | 47 | calcination in air | | | | | — | — | 1,100 | 180 |
| Comparative Example 3 | aluminum hydroxide C | 47 | calcination in air | | | | | — | — | 1,300 | 180 |

On reaching a prescribed temperature, the furnace was maintained at that temperature (hereinafter referred to as a calcining temperature) for a prescribed time (hereinafter referred to as a keeping time). After a lapse of a prescribed keeping time, the furnace was allowed to cool to obtain α-alumina in a powder form.

TABLE 2

| | Number Average Particle Diameter (μm) | Crystal Shape D/H | Crystal Shape Crystal Habit | Number of Crystal Planes | Size Distribution D90/D10 | Alumina Purity (wt %) | Na₂O Content (ppm) | Remark |
|---|---|---|---|---|---|---|---|---|
| Example 1 | 11 | 1–2 | F, H | 8 | 4 | 99.96 | 5 | |
| Example 2 | 11.6 | 1 | G | 12–18 | 3 | >99.95 | — | — |
| Example 3 | 11 | 1 | G | 20 or more | 3 | >99.95 | — | — |
| Example 4 | 11 | 1 | G | 20 or more | 3 | >99.95 | — | — |
| Example 5 | 14 | 1 | F, H | 20 or more | 3 | 99.98 | 5 | — |
| Comparative Example 1 | — | | no formation of single crystal | | | — | — | — |
| Comparative Example 2 | — | | no formation of single crystal | | | — | — | κ-crystal, θ-crystal |
| Comparative Example 3 | 0.3 | | no formation of single crystal | | | 99.7 | — | α-crystal |

INDUSTRIAL UTILITY

The α-alumina according to the present invention can be obtained from raw materials of various kinds, purity, shapes, sizes, and compositions. Having no seed crystal therein unlike those prepared in conventional hydrothermal processes involving addition of a seed crystal, the α-alumina of the present invention is homogeneous in terms of structure. It comprises octahedral or higher polyhedral α-alumina single crystal particles having such homogeneity, particle fineness, and a narrow particle size distribution and containing no agglomerates.

More specifically, the single crystal particles constituting the α-alumina of the present invention have an average particle diameter of more than 5 μm and not more than 30 μm, a D/H ratio of from 0.5 to 3.0, and a D90/D10 ratio of not more than 10, preferably not more than 9, and not more than 7, and the α-alumina of the present invention has an alumina purity of 99.90% by weight or higher and a sodium content of less than 0.05% by weight in terms of Na₂O.

The α-alumina comprising α-alumina single crystal particles of high purity, uniform structure and narrow particle size distribution is suitable as an abrasive, a raw material for sintered products, a plasma flame spraying material, a filler, a raw material for single crystals, a raw material for a carrier of catalysts, a raw material for fluorescent substances, a raw material for encapsulations, a raw material for ceramic filters, etc. and is extremely useful in industry. Owing to the extremely high purity, the α-alumina of the present invention is particularly useful as a raw material for single crystals, such as yttrium aluminum garnet (YAG), sapphire, ruby, etc., and high purity sintered products to which α-alumina of low purity cannot be applied.

We claim:

1. α-Alumina consisting essentially of α-alumina single crystal particles characterized in that they are homogeneous containing no crystal seed inside said particles; have an octa- or higher polyhedral shape; have a D/H ratio of from 0.5 to 2, wherein D represents a maximum particle diameter parallel to a hexagonal lattice plane of a hexagonal close-packed lattice of said particles, and H represents a diameter perpendicular to said hexagonal lattice plane; have a number average particle diameter of more than 5 μm and not more than 30 μm; have a sodium content of less than 5 ppm in terms of Na₂O; have an alumina purity of not less than 99.90% by weight; and have a particle size distribution wherein a D90/D10 ratio is not more than 10, wherein D10 and D90 represent a cumulative 10% diameter and a cumulative 90% diameter, respectively, of a cumulative distribution depicted from the small diameter side.

2. α-Alumina as claimed in claim 1, wherein the D/H ratio is 1 to 2.

3. α-Alumina as claimed in claim 1, wherein the D90/D10 ratio is 4 or less.

4. α-Alumina as in claim 1, characterized in that said α-alumina has an alumina purity of not less than 99.95% by weight.

* * * * *